(12) United States Patent
Noel et al.

(10) Patent No.: US 10,043,581 B2
(45) Date of Patent: Aug. 7, 2018

(54) MEMORY CIRCUIT CAPABLE OF IMPLEMENTING CALCULATION OPERATIONS

(71) Applicant: Commissariat à l'Énergie Atomique et aux Énergies Alternatives, Paris (FR)

(72) Inventors: Jean-Philippe Noel, Montbonnot Saint Martin (FR); Kaya Can Akyel, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/603,284

(22) Filed: May 23, 2017

(65) Prior Publication Data
US 2017/0345505 A1    Nov. 30, 2017

(30) Foreign Application Priority Data

May 24, 2016    (FR) ...................................... 16 54623

(51) Int. Cl.
| | |
|---|---|
| *G06F 17/30* | (2006.01) |
| *G11C 16/10* | (2006.01) |
| *G11C 14/00* | (2006.01) |
| *G11C 16/24* | (2006.01) |
| *G11C 7/10* | (2006.01) |
| *G11C 11/417* | (2006.01) |
| *G11C 11/412* | (2006.01) |

(52) U.S. Cl.
CPC ............ *G11C 16/10* (2013.01); *G11C 7/1006* (2013.01); *G11C 11/417* (2013.01); *G11C 14/009* (2013.01); *G11C 14/0063* (2013.01); *G11C 16/24* (2013.01); *G11C 11/412* (2013.01)

(58) Field of Classification Search
CPC ...................................... G11C 7/1006
USPC .................................... 365/189.011
See application file for complete search history.

(56) References Cited

U.S. PATENT DOCUMENTS

| | | | |
|---|---|---|---|
| 5,365,480 A | 11/1994 | Yamamura et al. | |
| 2006/0250880 A1* | 11/2006 | Ramaraju | G11C 8/16 365/230.05 |

(Continued)

OTHER PUBLICATIONS

French Search Report for Application No. FR 1654623 dated Feb. 10, 2017.

(Continued)

*Primary Examiner* — Min Huang
(74) *Attorney, Agent, or Firm* — Wolf, Greenfield & Sacks, P.C.

(57) ABSTRACT

A memory circuit capable of implementing calculation operations, including: memory cells arranged in rows and in columns, each cell including: a data bit storage node, a read-out transistor connected by its gate to the storage node, and a selection transistor series-connected with the read-out transistor between a reference node and a conductive output track common to all the cells of a same column; and a control circuit configured to simultaneously activate the selection transistors of at least two cells of a same column of the circuit, and to read from the conductive output track of the column a value representative of the result of a logic operation having as operands the data of the two cells.

17 Claims, 9 Drawing Sheets

(56) References Cited

U.S. PATENT DOCUMENTS

| | | | | |
|---|---|---|---|---|
| 2009/0141537 A1* | 6/2009 | Arsovski | ............ | G11C 7/1006 365/154 |
| 2009/0316500 A1* | 12/2009 | Mikan, Jr. | ................ | G11C 7/02 365/189.14 |
| 2016/0125919 A1 | 5/2016 | Hush | | |
| 2017/0345481 A1* | 11/2017 | Hush | ...................... | G11C 7/065 |
| 2017/0358331 A1* | 12/2017 | La Fratta | ................ | G11C 7/06 |

OTHER PUBLICATIONS

Jeloka et al., A 28 nm Configurable Memory (TCAM/BCAM/SRAM) Using Push-Rule 6T Bit Cell Enabling Logic-in-Memory. IEEE Journal of Solid-State Circuits. Apr. 2016;51(4):1009-21.

European Search Report for Application No. 17172088.1 dated Nov. 7, 2017.

Kobayashi et al., A Bit-Parallel Block-Parallel Functional Memory Type Parallel Processor LSI for Fast Addition and Multiplication. Symposium on VLSI Circuits Digest of Technical Papers. Jun. 8-10, 1995; New York, IEEE, US. pp. 61-62.

\* cited by examiner

MEMORY CIRCUIT CAPABLE OF IMPLEMENTING CALCULATION OPERATIONS

CROSS-REFERENCE TO RELATED APPLICATION

This application claims priority to French patent application number 16/54623, filed May 24, 2016, the content of which is hereby incorporated by reference in its entirety to the maximum extent allowable by law.

BACKGROUND

The present disclosure relates to the field of digital calculation circuits.

DISCUSSION OF THE RELATED ART

Conventionally, a digital calculation circuit, for example, a microprocessor, comprises an internal memory (register bank, cache memory, etc.), and an arithmetic and logic unit (ALU) capable of implementing basic arithmetic and/or logic operations to process data contained in the internal memory of the circuit.

The increase of the operating speed of digital calculation circuits is limited by the operating speed of the internal memory, which does not follow the same increase as that of the arithmetic and logic unit.

Existing architectures are also limited by the long length of the conductive routing tracks connecting the inner memory to the arithmetic and logic unit, which results in a significant power consumption and in a high heat dissipation for each data transfer between the internal memory and the arithmetic and logic unit.

SUMMARY

Thus, an embodiment provides a memory circuit capable of implementing calculation operations, the circuit comprising:

a plurality of elementary memory cells arranged in rows and in columns, each cell comprising:
a first data bit storage node,
a first read-out transistor connected by its gate to said first storage node,
and
a first selection transistor series-connected with the first read-out transistor between a first node of application of a reference potential of the cell and a first conductive output track common to all the cells of a same column of the circuit;
and a control circuit configured to simultaneously activate the first selection transistors of at least two cells of a same column of the circuit, and to read from the first conductive output track of the column a value representative of the result of a first logic operation having as operands the data stored in said at least two cells.

According to an embodiment, the memory circuit further comprises, for each column of the circuit, a first inverter having an input node connected to the first conductive output track of the column.

According to an embodiment, each elementary cell further comprises:
a second node for storing a data bit complementary to the bit stored on the first storage node of the cell,
a second read-out transistor connected by its gate to said second storage node, and
a second selection transistor series-connected with the second read-out transistor between a second node of application of a reference potential of the cell and a second conductive output track common to all the cells of a same column of the circuit,
the control circuit being further configured to simultaneously activate the second selection transistors of at least two cells of a same column of the circuit, and to read from the second conductive output track of the column a value representative of the result of a second logic operation having as operands the data stored in said at least two cells.

According to an embodiment, the control circuit is further configured to simultaneously activate:
the first and second selection transistors of two cells of a same column of the circuit; or
the first selection transistor of a first circuit cell and the second selection transistor of a second cell of the same column.

According to an embodiment, the memory circuit further comprises, for each column of the circuit, a second inverter having an input node connected to the second conductive output track of the column.

According to an embodiment, the memory circuit further comprises, for each column of the circuit, a NOR logic gate having a first input connected to the first conductive output track of the column and having a second input connected to the second conductive output track of the column.

According to an embodiment, the memory circuit further comprises, for each column of the circuit, a first NAND logic gate having a first input connected to an output node of the NOR logic gate of the column, and a second NAND logic gate having a first input connected to an output node of the first NAND logic gate of the column and having a second input connected to the second conductive output track of the column.

According to an embodiment, in each column except for the first column of the circuit, the first NAND logic gate has a second input connected to the second conductive output track of a column of previous rank of the circuit.

According to an embodiment, the memory circuit further comprises, for each column: a first conductive reference track interconnecting the first nodes of application of a reference potential of the column; and a second conductive reference track interconnecting the second nodes of application of a reference potential of the column.

According to an embodiment, the memory circuit further comprises, for each column: a first reference transistor connecting the first conductive reference track to a reference node; and a second reference transistor connecting the second conductive reference track to said reference node.

According to an embodiment, the memory circuit further comprises, for each column, an AND logic gate, an OR logic gate, and third, fourth, fifth, and sixth inverters, and: the AND logic gate has a first input connected to a node of application of a first binary control signal via the third inverter, and a second input connected to a node of application of a second binary control signal via the fourth inverter; the output of the third inverter is connected to the first conductive reference track of the column via the fifth inverter; the OR logic gate has a first input connected to the first conductive output track of the column, and a second input connected to the output of the AND logic gate; and the output of the OR logic gate is connected to the second conductive reference track of the column via the sixth inverter.

According to an embodiment, the memory circuit further comprises, for each column of the circuit: a first multiplexer having a first input connected to the input of the first inverter and a second input connected to the output of the first inverter; a third inverter having its input connected to the output of the first multiplexer; a third NAND gate having a first input connected to the output of the first multiplexer and having a second input connected to the input of the second inverter; a fourth NAND gate having a first input connected to the output of the third inverter and having a second input connected to the output of the second inverter; and a fifth NAND gate having a first input connected to the output of the third NAND gate and having its output connected to the output of the fourth NAND gate.

According to an embodiment, the elementary memory cells are SRAM-type volatile memory cells.

According to an embodiment, the elementary memory cells are non-volatile resistive memory cells.

The foregoing and other features and advantages will be discussed in detail in the following non-limiting description of specific embodiments in connection with the accompanying drawings.

DETAILED DESCRIPTION

Figure 1:
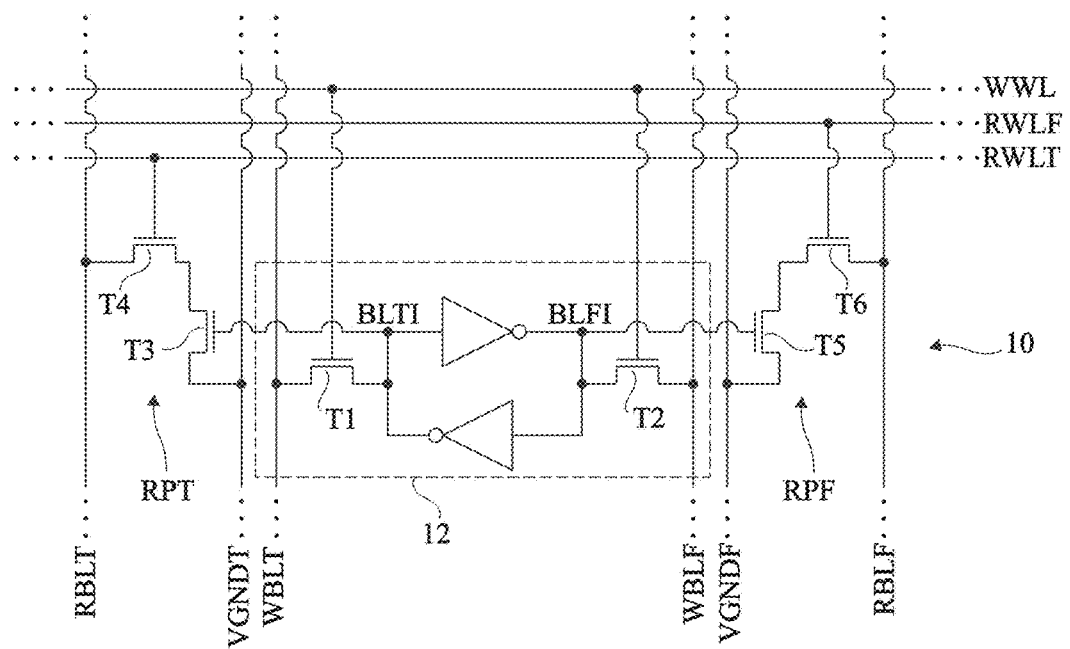
FIG. 1 is an electric diagram of an example of a memory circuit according to an embodiment.

The same elements have been designated with the same reference numerals in the different drawings. For clarity, only those elements which are useful to the understanding of the described embodiments have been shown and are detailed. In the following description, references to high- and low-level signals should be interpreted relatively, as corresponding to two different states of the binary signals processed by the described circuits. As an example, the high-level signals correspond to potentials in the order of a high power supply potential VDD of the described circuits (for example, equal to VDD to within 0.5 V), and the low-level signals correspond to potentials in the order of a low power supply potential GND of the described circuits (for example, equal to GND to within 0.5 V).

According to an aspect of the described embodiments, a memory circuit capable not only of storing data, but also of executing, in situ, during accesses to the memory content, a number of logic and/or arithmetic operations having as operands data stored in the circuit, is provided. The results of the calculations may be transmitted to circuits external to the memory, and/or be written back into the memory.

FIG. 1 is an electric diagram of another example of an elementary cell 10 of a memory circuit according to another embodiment.

Elementary cell 10 of FIG. 1 is a cell comprising ten transistors. It comprises a SRAM storage cell 12 comprising six transistors, and two read ports RPT and RPF comprising two transistors each. Storage cell 12 comprises two inverters (two transistors each) assembled in antiparallel between a first data bit storage node BLTI and a second node BLFI for storing a data bit complementary to the bit stored on node BLTI. Storage cell 12 further comprises a first write access transistor T1 connecting by its conduction nodes node BLTI to a conductive write track WBLT, and a second write access transistor T2, connecting by its conduction nodes node BLFI to a conductive write track WBLF. The gates of transistors T1 and T2 are connected to a same conductive write control track WWL. Read port RPT comprises two transistors T3 and T4 series-connected via their conduction nodes between a conductive track VGNDT of application of a reference potential and a conductive output track RBLT. Transistor T3 is located on the side of track VGNDT and has its gate connected to node BLTI, and transistor T4 is located on the side of track RBLT and has its gate connected to a conductive read control track RWLT. Read port RPF comprises two transistors T5 and T6 series-connected via their conduction nodes between a conductive track VGNDF of application of a reference potential and a conductive output track RBLF. Transistor T5 is located on the side of track VGNDF and has its gate connected to node BLFI, and transistor T6 is located on the side of track RBLF and has its gate connected to a conductive read control track RWLF. In this example, transistors T1, T2, T3, T4, T5, T6 are N-channel MOS transistors.

A memory circuit according to an embodiment comprises a plurality of elementary cells 10 of the type described in relation with FIG. 1, identical or similar, arranged in an array of rows and columns. The cells of a same row are interconnected via their conductive tracks WWL, respectively RWLF, respectively RWLT, and the cells of a same column are interconnected via their conductive tracks RBLT, respectively VGNDT, respectively WBLT, respectively WBLF, respectively VGNDF, respectively RBLF. In other words, the cells of a same row share a same conductive track WWL, a same conductive track RWLF, and a same conductive track RWLT, and the cells of a same column share a same conductive track RBLT, a same conductive track VGNDT, a same conductive track WBLT, a same conductive track WBLF, a same conductive track VGNDF, and a same conductive track RBLF. The cells of different rows have different conductive tracks WWL, respectively RWLF, respectively RWLT, and the cells of different columns have different conductive tracks RBLT, respectively VGNDT, respectively WBLT, respectively WBLF, respectively VGNDF, respectively RBLF.

To read from an elementary cell 10 of the memory via its read port RPT, the conductive output track RBLT of the cell is precharged to a high level, for example, to power supply voltage VDD of the circuit. Conductive track VGNDT is maintained at a low level, for example, at low potential GND used as a reference for power supply voltage VDD of the circuit. Transistor T4 of the cell is then turned on by application of a high-level signal to conductive track RWLT of the cell. After the activation of transistor T4, conductive track RBLT discharges if the potential of node BLTI is at a high level (transistor T3 on) and remains substantially at its precharge level if potential BLTI is at a low level (transistor T3 off). The reading of the potential of track RBLT via a read circuit not shown, for example, arranged at the foot of the column, enables to determine the value of the data bit stored in the elementary cell. The cell may further be read from substantially in the same way via its read port RPF.

Figure 2:
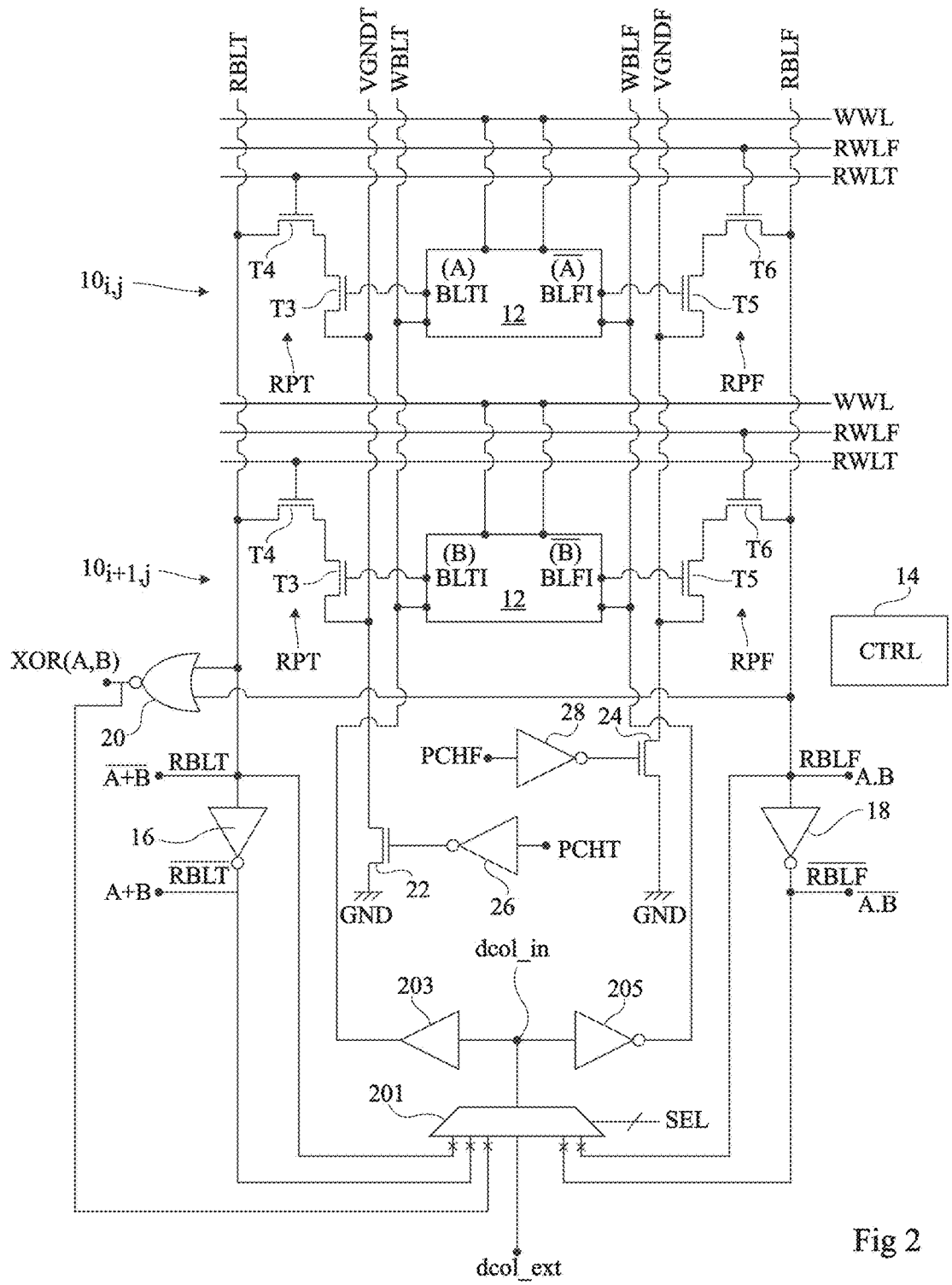
FIG. 2 schematically shows an example of a memory circuit according to an embodiment.

FIG. 2 schematically shows an embodiment of a memory circuit capable of implementing calculation operations. For simplification, only two elementary cells $10_{i,j}$ and $10_{i+1,j}$ of a same column of the memory circuit have been shown in FIG. 2, i and j being indexes respectively designating the rank of the row containing the cell and the rank of the column containing the cell, i being an integer in the range from 1 to M and j being an integer in the range from 1 to N, M and N being integers respectively designating the number of rows and the number of columns of the memory circuit. Further, the storage cells 12 of the elementary cells have not been detailed in FIG. 2.

The memory circuit of FIG. 2 comprises a control circuit 14 (CTRL). Control circuit 14 is capable of controlling the memory circuit to implement conventional read operations of the type described in relation with FIG. 1, or to implement write operations via conductive write access tracks WBLT, WBLF, and WWL of the cells.

According to an aspect of an embodiment, control circuit 14 is further capable of controlling the memory circuit to implement calculation operations. To achieve this, control circuit 14 is capable of simultaneously activating in read mode two or a number greater than two of elementary cells of a same column of the circuit, via access ports RPT, and/or via access ports RPF of these cells.

As an illustration, it is considered that the two cells $10_{i,j}$ and $10_{i+1,j}$ shown in FIG. 2 are simultaneously activated in read mode via their ports RPT and RPF. To achieve this, after having precharged conductive output tracks RBLT and RBLF of the column to a high level and set conductive reference tracks VGNDT and VGNDF of the column to a low level, the selection transistors T4 and T6 of the two cells $10_{i,j}$ and $10_{i+1,j}$ are simultaneously turned on by control circuit 14, via the conductive control tracks RWLT and RWLF of rows $10_{i,j}$ and $10_{i+1,j}$. Call A the binary value stored on node BLTI of cell $10_{i,j}$ and B the binary value stored on node BLTI of cell $10_{i+1,j}$. Cell $10_{i,j}$ then stores on its node BLFI the complementary $\overline{A}$ of value A, and cell $10_{i+1,j}$ stores on its node BLFI the complementary $\overline{B}$ of value B. Conductive output track RBLT of the column remains at its high precharge level only if the two values A and B are at a low level. Thus, the level read from output track RBLT of the column at the end of the read operation corresponds to result $\overline{A+B}$ of a logic NOR calculation operation between the two selected memory cells. Further, conductive output track RBLF of the column remains at its high precharge level only if the two values A and B are at a high level. Thus, the level read from output track RBLF of the column at the end of the read operation corresponds to result A.B of a logic AND calculation operation between the two selected memory cells.

In the example of FIG. 2, the memory circuit further comprises, for each column in the array, for example, arranged at the foot of the column, an inverter 16 having its input connected to conductive output track RBLT of the column and an inverter 18 having its input connected to conductive output track RBLF of the column. Thus, at the end of a read operation of the above-described type, the level read from output node $\overline{RBLT}$ of inverter 16 corresponds to result A+B of a logic OR calculation operation between the two selected memory cells, and the level read from output node $\overline{RBLF}$ of inverter 18 corresponds to result $\overline{A.B}$ of a logic NAND calculation operation between the two selected memory cells.

Further, in the example of FIG. 2, the memory circuit further comprises, for each column in the array, for example, arranged at the foot of the column, a NOR logic gate 20 comprising two inputs and one output, the inputs of gate 20 being respectively connected to track RBLT and to track RBLF. At the end of a read operation of the above-described type, the level read from the output of gate 20 corresponds to the result of a logic NOR calculation operation between values $\overline{A+B}$ and A.B, that is, to result XOR(A,B) of a logic XOR calculation operation between the two selected memory cells.

By simultaneously activating in read mode a number greater than two of cells of a same column, the above-mentioned logic operations may be implemented with a number of operands greater than 2. Further, by simultaneously activating in read mode a plurality of circuit columns, the logic operations may be implemented on words comprising a plurality of bits.

An advantage of the memory circuit of FIG. 2 is that it enables to directly implement basic logic operations in the memory, without requiring to have the data transit through an arithmetic and logic unit external to the circuit.

This enables to decrease the power consumption and the electric power dissipation due to the data transfer between the memory and the arithmetic and logic unit.

This further enables to increase the calculation execution speed. Indeed, in a conventional architecture comprising an arithmetic and logic unit external to the memory, the execution of a logic calculation operation with K operands, K being an integer greater than or equal to 2, further comprises, in addition to the actual calculation steps, K successive memory reading steps to read the K operands to be processed, and a possible step of writing back the result of the operation into the memory. In the embodiment of FIG. 2, the execution of a logic calculation operation with K operands may be carried out within a time as short as the time necessary to implement a single memory reading cycle. The result of the operation may be read from the memory output and/or written back into the memory during a subsequent write operation.

It should further be noted that in the embodiment of FIG. 2, a plurality of logic operations of different natures may be carried out in parallel on a same memory column (the OR, NOR, AND, NAND, and XOR operations in the above-described example).

In the example of FIG. 2, in each column of the memory cell, conductive track VGNDT of the column is connected to ground (GND) via a transistor 22 and conductive track VGNDF is connected to ground (GND) via a transistor 24. Transistor 22 has its gate connected to a control node PCHT via an inverter 26, and transistor 24 has its gate connected to a control node PCHF via an inverter 28. In this example, transistors 22 and 24 are N-channel MOS transistors. Nodes PCHT and PCHF are set to a low level by control circuit 14 during read and/or logic calculation operations to take conductive tracks VGNDT and VGNDF down to a low level and allow, if need be (according to the values of the data contained in the selected cells), the discharge of conductive tracks RBLT and RBLF. Outside of read and/or logic calculation operations, nodes PCHT and PCHF are maintained at a high level to limit leakage currents via the read ports. In particular, when one or a plurality of rows are activated during a read and/or logic calculation operation, the nodes PCHT and PCHF of the columns which are not been selected for the operation are maintained at a high level.

To enable to write back the result of a logic operation without having the calculated data transit through circuits external to the memory, and particular over a data bus external to the memory, the memory circuit of FIG. 2 further comprises, for each column in the array, for example, arranged at the foot of the column, an internal redirection circuit 201 enabling to connect at least one of the output nodes of the column, that is, in this example, nodes RBLT, RBLF, $\overline{\text{RBLT}}$, $\overline{\text{RBLF}}$ and the output node of gate 20, to a data input node dcol_in of the column. In the shown example, redirection circuit 201 is a six-input-to-one-output multiplexer. More particularly, multiplexer 201 comprises five inputs respectively connected to node RBLT, to node RBLF, to node $\overline{\text{RBLT}}$, to node $\overline{\text{RBLF}}$, and to the output node of gate 20, and a sixth input connected to a node dcol_ext of application of binary data originating from the outside of the memory (for example, connected to a data input bus external to the memory circuit). The multiplexer output is connected to data input node dcol_in of the column. In the shown example, the memory circuit comprises, for each column in the array, a buffer 203 connecting node dcol_in to conductive track WBLT of the column and an inverter 205 connecting node dcol_in to conductive track WBLF of the column, to enable to simultaneously write the binary data applied to node dcol_in on track WBLT and its complementary on track WBLF. Multiplexer 201 receives a control signal SEL, for example, supplied by memory control circuit 14, enabling, during a read operation, to select the data to be written into the column. It should be noted that latches, represented by crosses in FIG. 2, may optionally be provided between each of the column output nodes and the corresponding input node of multiplexer 201, to enable to store the data to be written between the end of the read operation (which may comprise a logic calculation operation having the read data as operands) and the actual operation of writing the data at an address provided by memory control circuit 14. As a variation, redirection circuit 201 may comprise a plurality of outputs connected to data input nodes dcol_in of different columns of the array, so that control circuit 14 can select, via selection signal SEL, a column for writing back the calculated data which is different from the column where the calculation has been performed.

Figure 9:
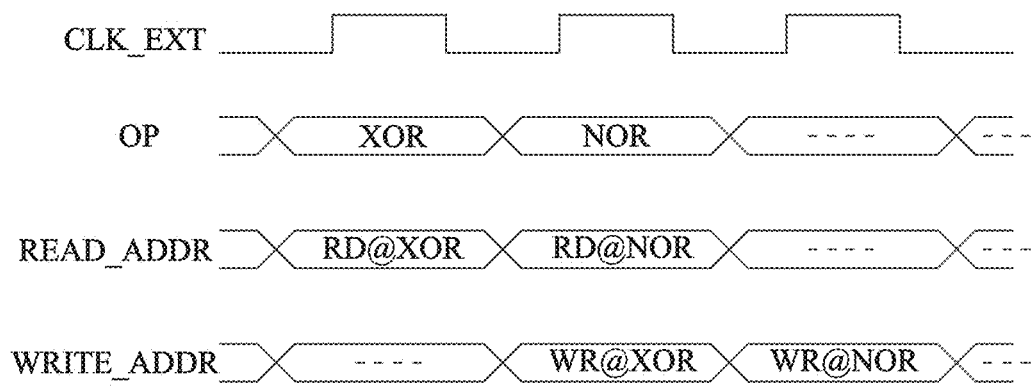
FIG. 9 is a timing diagram illustrating an example of operation of the memory circuit of FIG. 2.

FIG. 9 is a timing diagram illustrating an example of operation of the memory circuit of FIG. 2 during a phase of implementation of calculation operations with a writing back of the result of the operations into the memory, without for the calculated data to transit through external circuits.

FIG. 9 more particularly shows the time variation of:

an external clock signal CLK_EXT supplied by an external circuit and rating the operation of the memory circuit;

an external control signal OP supplied by an external circuit and indicating to the memory circuit the type of operation to be performed, as well as the address(es) concerned by the operation;

an internal address signal READ_ADDR generated by memory control circuit 14 from signal OP, corresponding to the read address or addresses concerned by the operation to be performed, that is, to the address or to the addresses of the operands of the operation; and an internal address signal WRITE_ADDR generated by memory control circuit 14 from signal OP, corresponding to the address for writing back the result of the operation.

In the shown example, period $T_{CLK\_EXT}$ of clock signal CLK_EXT is equal to the memory cycle time, that is, to the time necessary to implement an operation of reading or writing data from and into the memory. In other words, a single read operation or a single write operation may be implemented during period $T_{CLK\_EXT}$.

At each rising edge of clock signal CLK_EXT, memory control circuit 14 samples signal OP, extracts from signal OP signal READ_ADDR, and selects in read mode the corresponding rows of the array, containing the operands of the operation to be carried out. Control circuit 14 further extracts from signal OP signal WRITE_ADDR and stores it for a subsequent writing back of the result of the operation into the memory.

The actual calculation operation is carried out within a clock signal $T_{CLK\_EXT}$ as previously explained.

At the next rising edge of signal CLK_EXT, signal OP is sampled again and a next operation can start. Simultaneously, control circuit 14 selects in write mode the row corresponding to signal WRITE_ADDR stored during the previous cycle, and controls redirection circuit 201, via signal SEL, to write into this row the result of the operation carried out at the previous cycle.

As a variation, period $T_{CLK\_EXT}$ of signal CLK_EXT may be longer than the memory cycle time, for example, equal to a multiple of the memory cycle time. In this case, during a period of signal $T_{CLK\_EXT}$, a plurality of successive calculation (or read) and/or write operations may be performed. The sequencing of these operations may be performed asynchronously by means of a state machine internal to the memory circuit. As a variation, the memory circuit may comprise a circuit for generating an internal clock signal equal to the memory cycle time, this signal being used by control circuit 14 to synchronously sequence the operations.

In the alternative embodiments described hereafter, for simplification, redirection circuit 201 enabling to directly write back into the memory, without transiting through external circuits or buses, the result of an operation carried out inside of the memory, has neither been detailed nor shown in the drawings.

Figure 3:
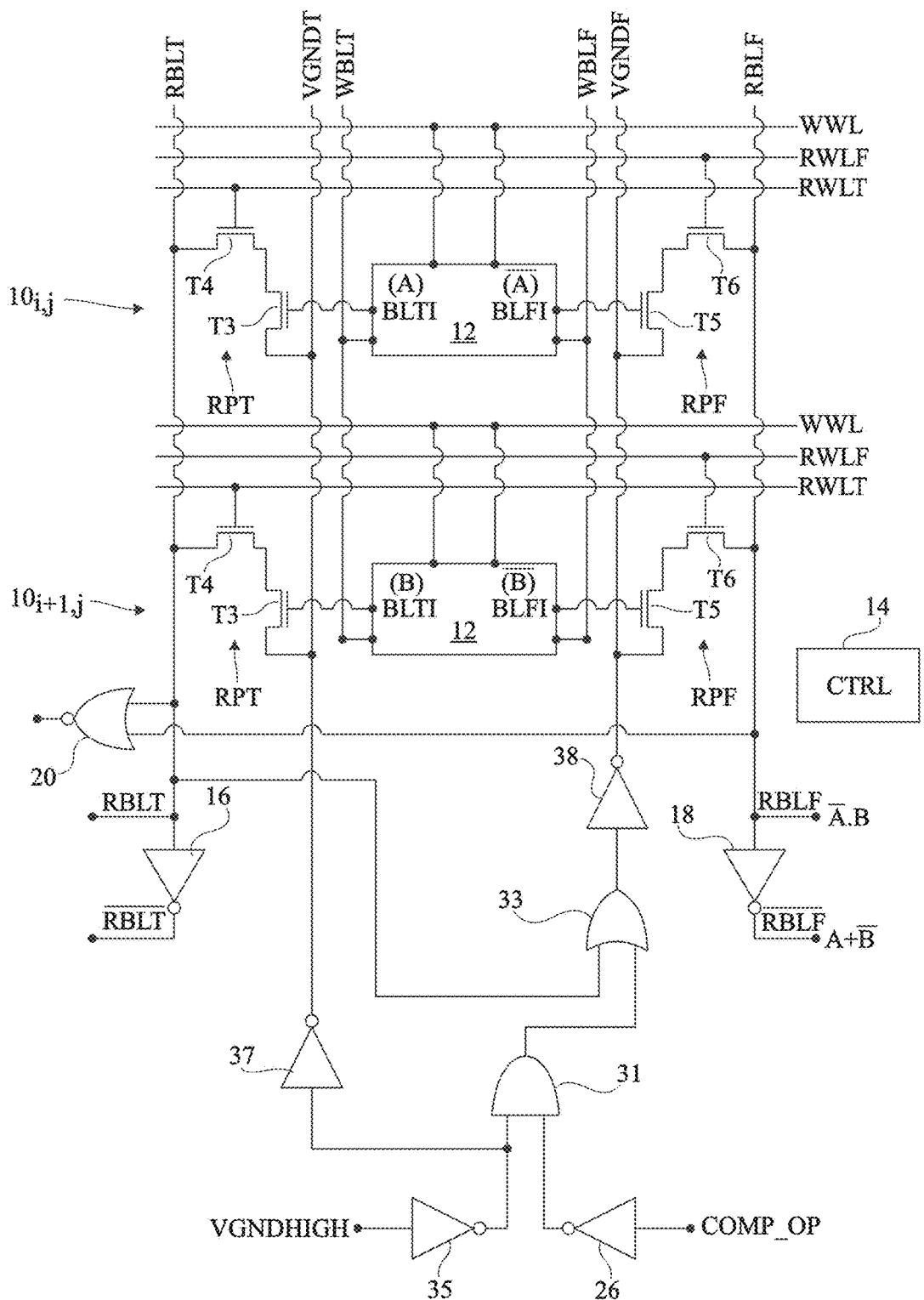
FIG. 3 schematically shows an alternative embodiment of the memory circuit of FIG. 2.

FIG. 3 schematically shows an alternative embodiment of the memory circuit of FIG. 2.

The memory circuit of FIG. 3 differs from the memory circuit of FIG. 2 mainly in that, in the circuit of FIG. 3, in each column of the array, inverters 26 and 28 and transistors 22 and 24 are replaced with other elements for controlling conductive reference tracks VGNDT and VGNDF of the column. More particularly, in the example of FIG. 3, the memory circuit comprises, for each memory column, an AND logic gate 31, an OR logic gate 33, and four inverters 35, 36, 37, and 38. AND logic gate 31 has a first input connected to a node of application of a first binary control signal VGNDHIGH via inverter 35, and a second input connected to a node of application of a second binary control signal COMP_OP via inverter 36. Thus, the AND logic gate receives, on its first input, complementary $\overline{\text{VGNDHIGH}}$ of signal VGNDHIGH, and on its second input, complementary $\overline{\text{COMP\_OP}}$ of signal COMP_OP. The first input of AND logic gate 31, or output of inverter 35, is further connected to conductive reference track VGNDT of the column via inverter 37. Thus, conductive track VGNDT is maintained in a high state when binary signal VGNDHIGH is in the high state, and in a low state when binary signal VGNDHIGH is in the low state. OR logic gate 33 has a first input connected to conductive output track RBLT of the column, and a second input connected to the output of AND logic gate 31. The output of OR logic gate 33 is connected to conductive reference track VGNDF of the column via inverter 38. Thus, conductive track VGNDF is maintained in a high state when the output of OR logic gate 33 is in the low state, and in a low state when the output of OR logic gate 33 is in the high state.

The memory circuit of FIG. 3 enables to perform the same basic logic operations as the circuit of FIG. 2. To achieve this, control circuit 14 maintains signals VGNDHIGH and COMP_OP in the low state in the column(s) concerned by a read or logic calculation operation. As a result, conductive reference tracks VGNDT and VGNDF of the column(s) concerned by the operation are maintained at a low potential, which allows, if need be (according to the values of the data contained in the selected cells), the discharge of conductive tracks RBLT and RBLF.

The memory circuit of FIG. 3 further enables to perform compound logic operations. To achieve this, circuit 14 maintains signals VGNDHIGH and COMP_OP in the high state in each column concerned by the operation. As a result, conductive reference track VGNDT of the column is maintained at a high potential. Further, the output of AND logic gate 31 is in the low state, so that the state, high or low, of the output of OR logic gate 33 is set by the level, high or low, of conductive output track RBLT of the column. Thus, conductive reference track VGNDF of the column is maintained in the low state when conductive output track RBLT of the column is in the high state, and is maintained in the high state when conductive output track RBLT of the column is in the low state.

Control circuit 14 then simultaneously activates in read mode two elementary cells of the column, cells $10_{i,j}$ and $10_{i+1,j}$ in the shown example. One of the two cells, cell $10_{i,j}$ in this example, is activated via its read port RPT, control circuit 14 maintaining read port RPF of this cell blocked. The other cell, cell $10_{i+1,j}$ in this example, is activated via its read port RPF, control circuit 14 maintaining read port RRT of this cell blocked.

After the activation of read port RPT of cell $10_{i,j}$, conductive output track RBLT of the column is in a state corresponding to binary complementary value $\overline{A}$ of binary value A stored on storage node BLTI of cell $10_{i,j}$. Value A is thus transferred onto conductive track VGNDF via OR logic gate 33 and inverter 38. The final level read from output track RBLF of the column at the end of the read operation then corresponds to result $\overline{A}.B$ of a compound logic operation. Further, inverted output $\overline{RBLF}$ of the column, that is, the output node of inverter 18, provides a signal corresponding to result $A+\overline{B}$ of the inverse logic operation.

Although an embodiment of a compound logic operation with two operands has been described herein, compound logic operations with more than two operands may be similarly implemented, by simultaneously activating in read mode a number greater than two of cells of a same column. Each activated cell is activated via a single one of its read ports RPT and RPF, at least one cell being activated via its port RPT and at least one cell being activated via its port RPF. Further, compound logic operations may be implemented on words of a plurality of bits by simultaneously activating a plurality of circuit columns.

The memory circuits of FIGS. 2 and 3 further enable to perform majority-type operations, enabling to determine whether a column of the array or a portion of a column of the array contains a majority of 1s or a majority of 0s. To achieve this, control circuit 14 simultaneously activates, for each elementary cell of the column or of the column portion concerned by the operation, the two read ports RPT and RPF of the cell, after having precharged conductive output tracks RBLT and RBLF of the column to a high level and, by maintaining conductive reference tracks VGNDT and VGNDF of the column at a low level. After a fixed predetermined discharge time, the sign of voltage difference $\Delta V = V_{RBLT} - V_{RBLF}$ between conductive tracks RBLT and RBLF of the column is determined. When the activated column or column portion contains a majority of 1s, output track RBLT discharges faster than output track RBLF, and voltage $\Delta V$ is negative at the end of the fixed discharge time. When, however, the activated column or column portion contains a majority of 0s, output track RBLF discharges faster than output track RBLT, and voltage $\Delta V$ is positive at the end of the fixed discharge time. The sign taken by voltage $\Delta V$ at the end of the predetermined discharge time thus enables to know whether the activated column or column portion contains a majority of 1s or a majority of 0s. The sign of voltage $\Delta V$ may be determined by means of an output amplifier, not shown for example, arranged at the foot of the column, capable of amplifying voltage difference $\Delta V = V_{RBLT} - V_{RBLF}$ and of supplying a binary signal representative of the sign of this difference.

Figure 4:
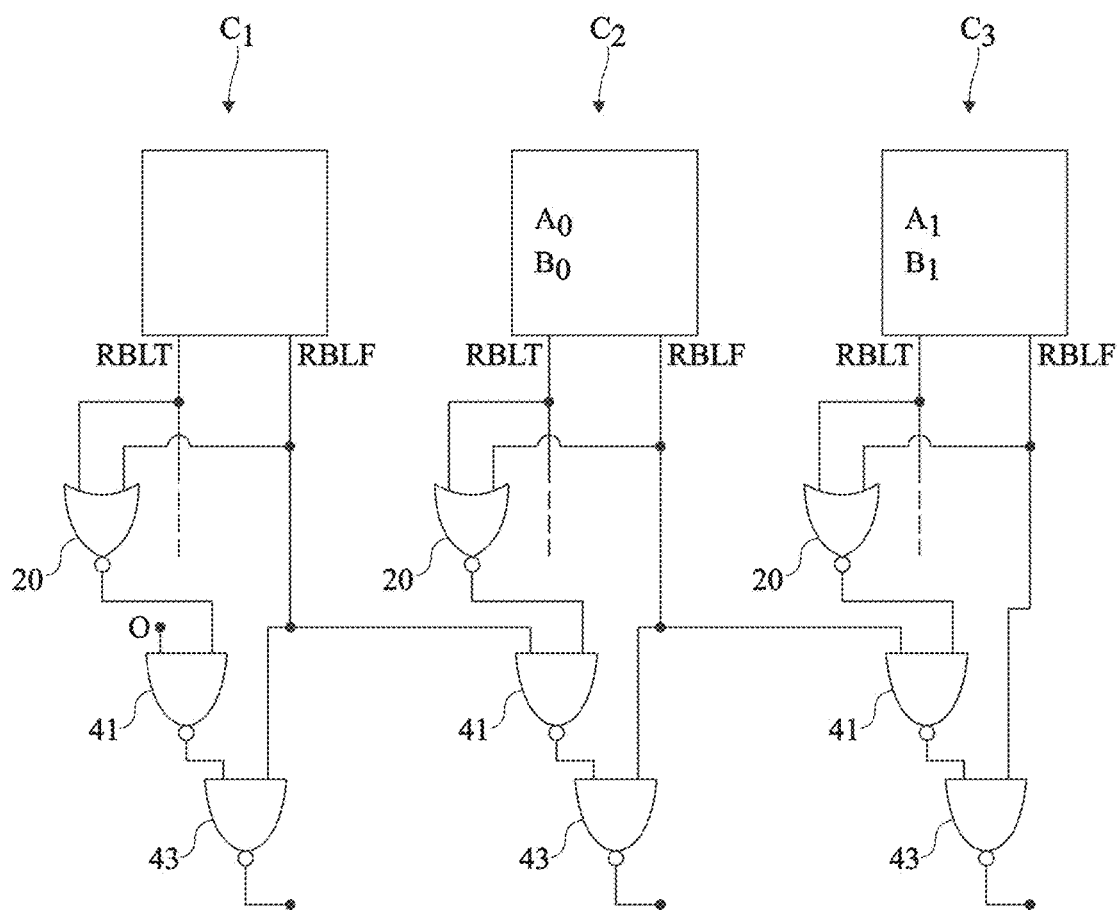
FIG. 4 schematically shows another variation of a memory circuit according to an embodiment.

FIG. 4 schematically shows another alternative embodiment of a memory circuit capable of implementing calculation operations.

The memory circuit of FIG. 4 for example comprises the same elements as the memory circuit of FIG. 2 or 3, arranged substantially in the same way, and further comprises additional circuit elements enabling to implement arithmetic calculation operations.

More particularly, the circuit of FIG. 4 comprises, for each array column, in addition to the elements described in relation with FIGS. 2 and 3, two NAND gates 41 and 43 forming with NOR gate 20 of the column a half-adder. In each column of rank j of the array, except for the first column (j=1), gate 41 has a first input connected to conductive output track RBLF of the column of previous rank (j−1) and a second input connected to the output of NOR gate 20 of the column of rank j. Gate 41 of the column of rank j=1 has a first input connected to a node of application of a signal of low level (binary value 0), and a second input connected to the output of NOR gate 20 of the column of rank j=1. Each NAND gate 41 further has a second input connected to the output of NOR gate 20 of the column containing it. Each NAND gate 43 has a first input connected to conductive output track RBLF of the column containing it, and a second input connected to the output of NAND gate 41 of the column containing it.

In the example of FIG. 4, only the first three columns $C_1$, $C_2$, $C_3$ of the array has been shown. Further, these columns have not been detailed. In particular, in FIG. 4, the elementary cells present in each column are not detailed. Only the conductive output tracks RBLT and RBLF of each column, as well as the logic gates 20, 41, and 43 associated with each column, are detailed. Further, control circuit 14 of the memory circuit has not been shown in FIG. 4.

The way in which an addition operation with two two-bit operands $A_0A_1$ and $B_0B_1$ is carried out will now be described in relation with FIG. 4. The two bits $A_0$ and $A_1$ of the first operand are stored in two cells of a same first row of the memory, respectively in column $C_2$ and in column $C_3$ in the shown example, and the two bits $B_0$ and $B_1$ of the second operand are stored in two cells of a same second row of the memory, in the same columns as bits $A_0$ and $A_1$ respectively, that is, in columns $C_2$ and $C_3$ in this example. The time of execution of the addition operation, corresponds to the time necessary to implement three read cycles in the memory.

In a first cycle, control circuit 14 is controlled identically or similarly to what has been described in relation with FIG.

2, to simultaneously activate in read mode, via the two read ports RPT and RPF, the two rows of the memory circuit respectively containing bits $A_0$ and $A_1$ and bits $B_0$ and $B_1$, after having precharged to a high level output tracks RBLT and RBLF of columns $C_2$ and $C_3$, and having turned on transistors 22 and 24 (not shown in FIG. 4) of columns $C_2$ and $C_3$. At the end of the first cycle, output signal $S_{i0}$ of NOR gate 20 of column $C_2$ corresponds to the result of an XOR operation between bits $A_0$ and $B_0$, and output signal $S_{i1}$ of NOR gate 20 of column $C_3$ corresponds to the result of an XOR operation between bits $A_1$ and $B_1$. Signals $S_{i0}$ and $S_{i1}$ correspond to the results, in each column, of the carryless sum of values $A_0$ and $B_0$, respectively $A_1$ and $B_1$. The signal present on output track RBLF of column $C_1$ corresponds to input carry $C_{in0}$ of the half-adder of column $C_2$, and the signal present on output track RBLF of column $C_3$ corresponds to input carry $C_{in1}$ of the half-adder of column $C_3$. The output signal of NAND gate 43 of column $C_1$ corresponds to output carry $C_{out0}$ of the half-adder of column $C_1$, the output signal of NAND gate 43 of column $C_2$ corresponds to output carry $C_{out1}$ of the half-adder of column $C_2$, and the output signal of NAND gate 43 of column $C_3$ corresponds to output carry $C_{out2}$ of the half-adder of column $C_3$. At the end of the first cycle, values $S_{i0}$ and $S_{i1}$ are respectively written into columns $C_2$ and $C_3$, in a same row of the memory circuit different from the rows containing values $A_0$, $A_1$ and $B_0$, $B_1$.

During a second cycle consecutive to the first cycle, conductive output tracks RBLT and RBLF are not recharged to a high level, so that the values of carries $C_{in0}$, $C_{in1}$, $C_{out0}$, $C_{out1}$, $C_{out2}$ are kept. During the second cycle, output carries $C_{out0}$ and $C_{out1}$, respectively available on the output node of the gate 43 of column $C_1$ and on the output node of the gate 43 of column $C_2$, are respectively written into column $C_2$ and into column $C_3$, in a same row of the memory circuit different from the rows containing values $A_0$, $A_1$, $B_0$, $B_1$ and $S_{i0}$, $S_{i1}$.

In a third cycle consecutive to the second cycle, control circuit 14 is controlled again identically or similarly to what has been described in relation with FIG. 2, to simultaneously activate in read mode, via the two read ports RPT and RPF, the two rows of the memory circuit respectively containing bits $S_{i0}$ and $S_{i1}$ and bits $C_{out0}$ and $C_{out1}$, after having precharged to a high level output tracks RBLT and RBLF of columns $C_2$ and $C_3$, and turned on transistors 22 and 24 (not shown in FIG. 4) of columns $C_2$ and $C_3$. At the end of the third cycle, output signal S0 of NOR gate 20 of column $C_2$ corresponds to the result of an XOR operation between bits $S_{i0}$ and $C_{out0}$, and output signal S1 of NOR gate 20 of column $C_3$ corresponds to the result of an XOR operation between bits $S_{i1}$ and $C_{out1}$. Signals S0 and S1 respectively correspond to the most significant bit and to the least significant bit of the final result of the addition. The signal available on the output node of NAND gate 43 of column $C_3$ corresponds to final value $C_{out}$ of the carry of the addition.

Subtractions may be performed similarly, but with an additional cycle, since the value of the carries then no longer corresponds to an AND as in the case of the addition, but to a compound logic operation of type $A.\overline{B}$.

Increment or decrement operations may further be implemented by using the above-described addition/subtraction circuits.

Figure 5:
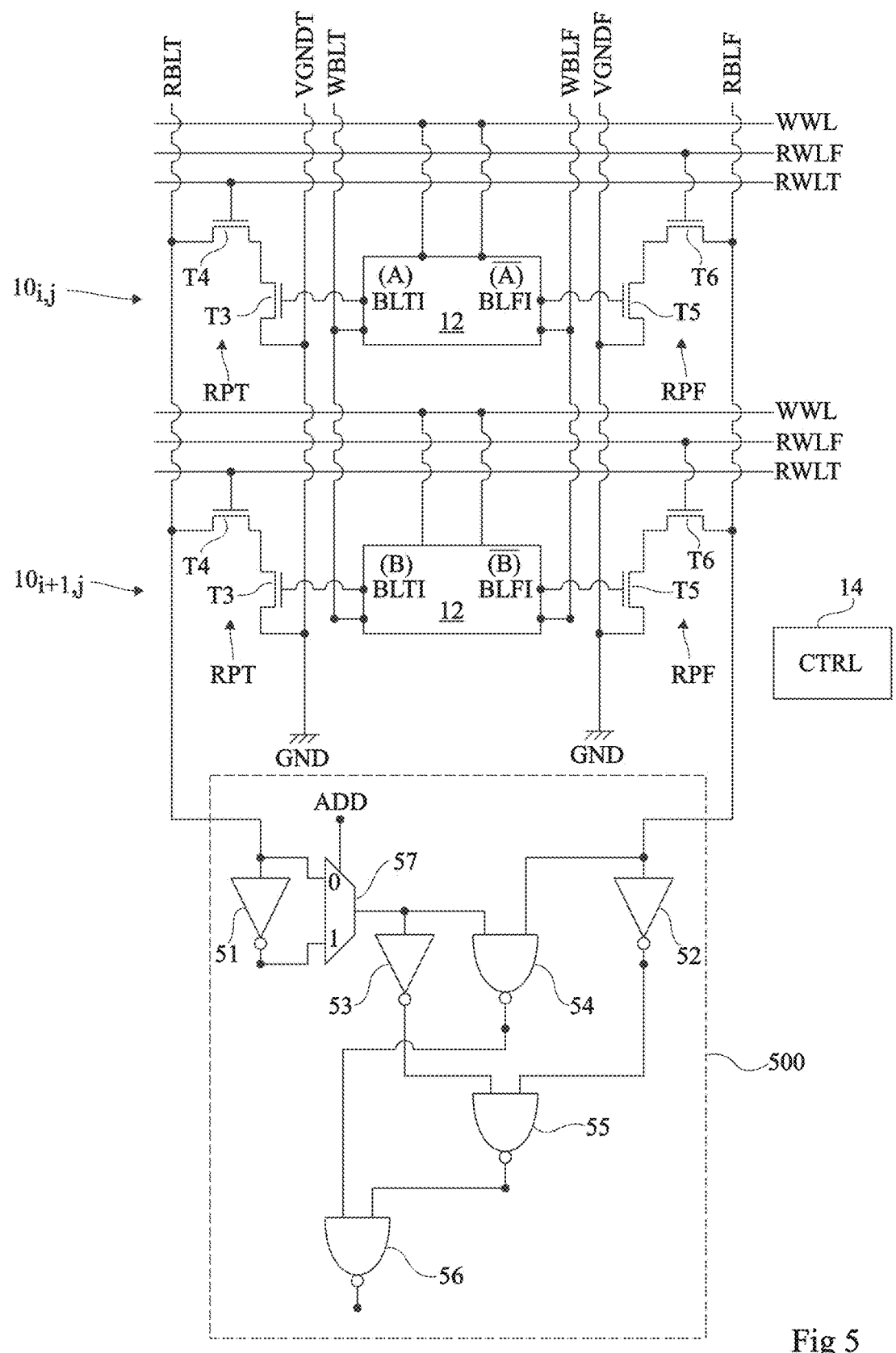
FIG. 5 schematically shows another example of a memory circuit according to an embodiment.

FIG. 5 schematically shows a particularly advantageous example of a memory circuit according to an embodiment.

The memory circuit of FIG. 5 differs from the memory circuit of FIG. 2 mainly in that, in the circuit of FIG. 5, in each column of the array, inverters 16 and 18 and NOR gate 20 are replaced with a logic circuit 500.

Logic circuit 500 comprises three inverters 51, 52, and 53, three NAND logic gates 54, 55, and 56, and a multiplexer 57 with two binary data inputs and one binary data output. Inverter 51 has its input connected to conductive output track RBLT of the column and inverter 52 has its input connected to conductive output track RBLF of the column. Multiplexer 57 has a first data input (0) connected to the input of inverter 51, and a second data input (1) connected to the output of inverter 51. The output of multiplexer 57 is connected to the input of inverter 53 and to a first input of NAND gate 54. Multiplexer 57 further comprises a control input ADD enabling to select the data input (0) or (1) of the multiplexer to be copied on its output. The second input of NAND gate 54 is connected to the input of inverter 52. The output of inverter 52 is connected to a first input of NAND gate 55 and the output of inverter 53 is connected to the second input of NAND gate 55. The output of NAND gate 54 is connected to a first input of NAND gate 56, and the output of NAND gate 55 is connected to the second input of NAND gate 56.

In the shown example, conductive reference tracks VGNDT and VGNDF of the column are directly connected to ground (GND). As a variation, conductive reference tracks VGNDT and VGNDF may be grounded via transistors 22 and 24 such as described in relation with FIG. 2.

Control circuit 14 (CTRL) is capable of controlling the memory circuit to implement conventional read operations of the type described in relation with FIG. 1, or to implement write operations via conductive write access tracks WBLT, WBLF, and WWL of the cells.

Control circuit 14 is further capable of controlling the memory circuit to implement a number of basic logic operations directly in the memory, without requiring to have the data transit through a unit external to the circuit.

To achieve this, control circuit 14 is capable of simultaneously activating in read mode two or a number greater than two of elementary cells of a same column of the circuit, via access ports RPT, and/or via access ports RPF of these cells.

As an illustration, it is considered that the two cells $10_{i,j}$ and $10_{i+1,j}$ shown in FIG. 5 are simultaneously activated in read mode, one (cell $10_{i,j}$) only via its port RPT, and the other (call $10_{i,j+1}$) only via its port RPF. To achieve this, after having precharged to a high level conductive output tracks RBLT and RBLF of the column and set to a low level conductive reference tracks VGNDT and VGNDF of the column, selection transistor T4 of cell $10_{i,j}$ and selection transistor T6 of cell $10_{i,j+1}$ are simultaneously turned on by control circuit 14, selection transistors T6 of cell $10_{i,j}$ and T4 of cell $10_{i,j+1}$ being maintained off. Call A the binary value stored on node BLTI of cell $10_{i,j}$ and B the binary value stored on node BLTI of cell $10_{i+1,j}$. Cell $10_{i,j}$ then stores on its node BLFI complementary $\overline{A}$ of value A, and cell $10_{i+1,j}$ stores on its node BLFI complementary $\overline{B}$ of value B. After the activation of cell $10_{i,j}$ via its port RPT and of cell $10_{i,j+1}$ via its port RPF, value $\overline{A}$ may be read from output track RBLT of the column and value B may be read from output track RBLF of the column. Values A and $\overline{B}$ may respectively be read from the output nodes of inverters 51 and 52. According to a first operating mode, multiplexer 57 is controlled by control circuit 14, via its control input ADD, to connect its first date input (0) to its output. Value $\overline{A}.B$ can then be read from the output node of NAND gate 54, and value $\overline{A}.\overline{B}$ can be read from the output node of NAND gate 55. The value on the output node of NAND gate 56 corresponds to result XOR(A,B) of an XOR operation between values A and B. According to a second embodiment, multiplexer 57 is controlled by control circuit 14 to connect its second data input (1) to its output. Value $\overline{A.B}$ can then be read from the output node of NAND gate 54, and value $\overline{\overline{A.B}}$ (that is, A OR B) can be read from the output node of NAND gate 55. The value on the output node of NAND gate 56 corresponds to result NXOR(A,B) of a complemented XOR operation between values A and B.

As a variation, it is considered that the two cells 10$_{i,j}$ and 10$_{i+1,j}$ shown in FIG. 5 are simultaneously activated in read mode via their two read ports RPT and RPF. To achieve this, after having precharged to a high level conductive output tracks RBLT and RBLF of the column and set to a low level conductive reference tracks VGNDT and VGNDF of the column, selection transistors T4 and T6 of cell 10$_{i,j}$ and selection transistors T4 and T6 of cell 10$_{i,j+1}$ are simultaneously turned on by control circuit 14. After the activation of cell 10$_{i,j}$ via its ports RPT and RPF and of cell 10$_{i,j+1}$ via its ports RPT and RPF, value $\overline{A+B}$ (logic NOR operation) may be read from output track RBLT of the column and value A.B (logic AND operation) may be read from output track RBLF of the column. Values A+B (logic OR operation) and $\overline{A.B}$ (logic NAND operation) may respectively be read from the output nodes of inverters 51 and 52. According to a third operating mode, multiplexer 57 is controlled by control circuit 14 to connect its first data input (0) to its output. Value NXOR(A,B) can then be read from the output node of NAND gate 55, and value XOR(A,B) can be read from the output node of NAND gate 56. According to a fourth operating mode, multiplexer 57 is controlled by control circuit 14 to connect its second data input (1) to its output. Value $\overline{A.B}$ can then be read from the output node of NAND logic gate 54, value A+B can be read from the output node of NAND logic gate 55, and value NXOR(A,B) can be read from the output node of NAND gate 56.

By simultaneously activating in read mode a number greater than two of cells of a same column, the above-mentioned logic operations may be implemented with a number of operands greater than 2. Further, by simultaneously activating in read mode a plurality of circuit columns, the logic operations may be implemented on words comprising a plurality of bits.

Figure 6:
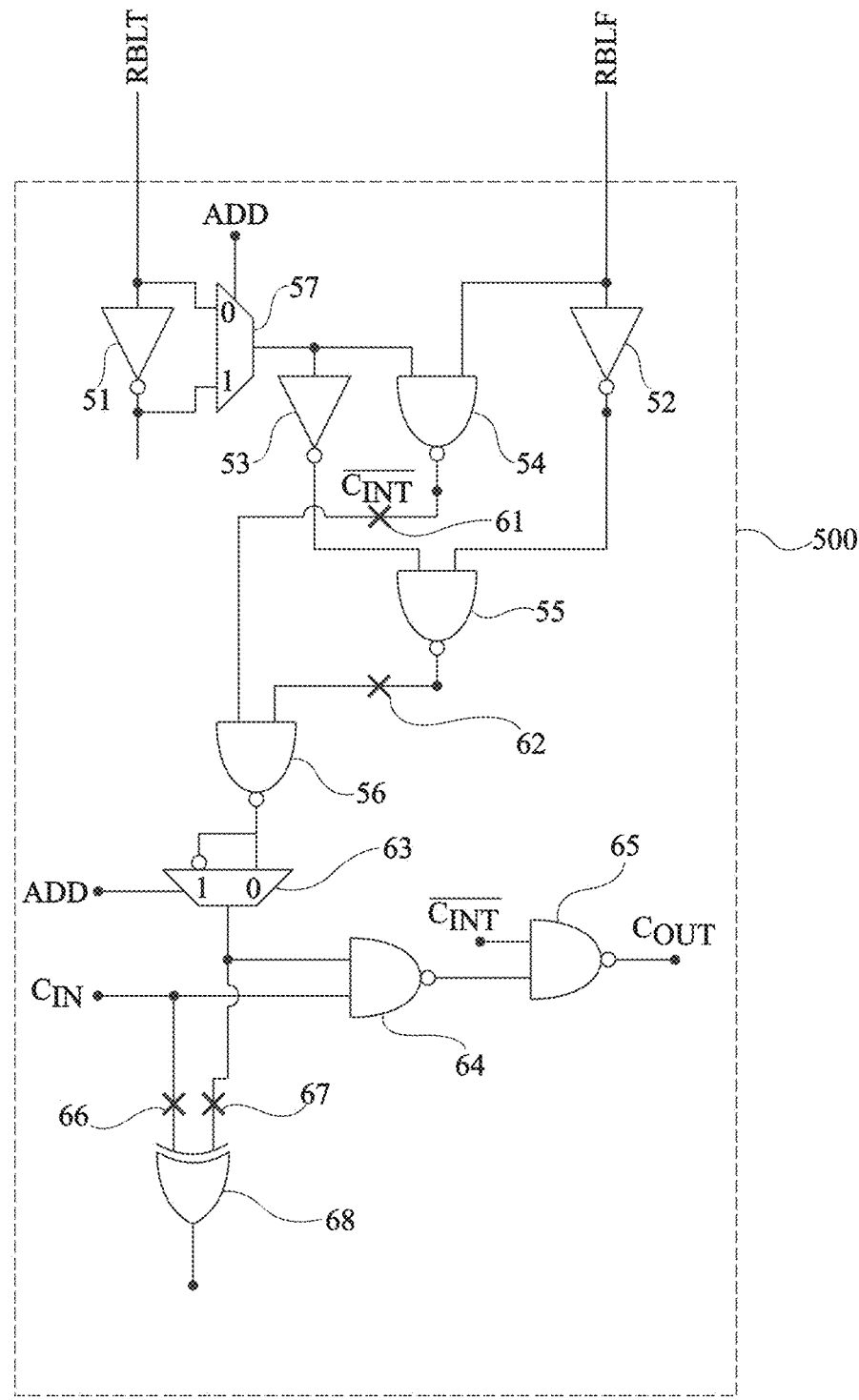
FIG. 6 schematically shows an alternative embodiment of the memory circuit of FIG. 5.

FIG. 6 schematically shows a particularly advantageous alternative embodiment of the memory circuit of FIG. 5.

The memory circuit of FIG. 6 comprises the same elements as the memory circuit of FIG. 5, arranged substantially in the same way, and differs from the memory circuit of FIG. 5 in that, in the memory circuit of FIG. 6, in each column of the array, logic circuit 500 comprises additional elements capable of implementing arithmetic operations. More particularly, in the example of FIG. 6, in each column of the array, logic circuit 500 further comprises a latch 61, for example, a D latch, having its input connected to the output node of NAND gate 54 and having its output connected to the first input of NAND gate 56 and of NAND gate 65, and a latch 62, for example, a D latch, having its input connected to the output node of NAND gate 55 and having its output connected to the second input of NAND gate 56. Circuit 500 further comprises a multiplexer 63 with two binary inputs and one binary output. Multiplexer 63 has a first data input (0) connected to the output of NAND logic gate 56, and a second data input (1) connected to an inverted output of NAND logic gate 56. Circuit 500 further comprises a NAND logic gate 64 having a first input connected to the output of multiplexer 63 and having its second input connected to a node $C_{IN}$. Multiplexer 63 further comprises a control input ADD enabling to select the data input (0) or (1) of the multiplexer to be copied on its output. Circuit 500 further comprises a NAND logic gate 65 having a first input connected to the output of NAND gate 64, and having its second input connected to a node $\overline{C_{INT}}$ connected to the output of latch 61. The output of NAND logic gate 65 is connected to a node $C_{OUT}$ of circuit 500. Circuit 500 further comprises a latch 66, for example, a D latch, having its input connected to node $C_{IN}$, and a latch 67, for example, a D latch, having its input connected to the output node of multiplexer 63. Circuit 500 further comprises a logic XOR gate 68 having a first input connected to the output of latch 66 and having its second input connected to the output of latch 67. The output of XOR gate 68 is connected to a node S of circuit 500.

In the memory circuit of FIG. 6, the circuits 500 of a plurality of columns of the array, for example, neighboring columns of the array, are chained via their nodes $C_{IN}$ and $C_{OUT}$ to form an addition/subtraction circuit. It is considered as an example that the circuits 500 of Q different columns of the array are chained to form a circuit of addition/subtraction of Q-bit operands. Reference 500$_k$ designates hereafter the circuit of the k-th column of the assembly of Q columns forming the addition-subtraction circuit, k being an integer in the range from 1 to Q and Q being an integer smaller than or equal to N (N designating the number of columns in the array). In this example, the columns of low rank k of the addition/subtraction circuit correspond to the least significant bits of the addition/subtraction circuit, and the columns of high rank k of the addition/subtraction circuit correspond to the most significant bits of the addition/subtraction circuit. Except for circuit 500$_1$, each circuit 500$_k$ of the addition/subtraction circuit has its node $C_{IN}$ connected to node $C_{OUT}$ of the circuit of previous rank 500$_{k-1}$. The addition/subtraction circuit further comprises an additional output latch, not shown, having its input connected to node $C_{OUT}$ of circuit 500$_Q$.

The way in which an addition operation with two Q-bit operands each is carried out will now be described. The Q bits $A_1, A_2, \ldots, A_k, \ldots A_Q$ (from the least significant bit to the most significant bit) of the first operand are stored in a first row of rank i1 of the memory, respectively in the Q columns of rank 1 to Q defining the addition/subtraction circuit. The Q bits $B_1, B_2, \ldots, B_k, \ldots B_Q$ (from the least significant bit to the most significant bit) of the second operand are stored in a same second row of rank i2 of the memory, respectively in the Q columns of rank 1 to Q of the memory defining the addition/subtraction circuit. In the example which will be described, the time of execution of the addition operation corresponds to the time necessary to implement three read cycles in the memory. The described embodiments are however not limited to this specific case.

During the addition operation, control circuit 14 applies a low-level potential corresponding to binary value '0', for example, potential GND, onto node $C_{IN}$ of circuit 500$_1$ of the addition/subtraction circuit. Further, control circuit 14 controls multiplexer 57 to connect its second data input (1) to its output, and controls multiplexer 63 to connect its second data input (1) to its output.

During a first cycle, control circuit 14 is controlled to simultaneously activate in read mode the two rows of rank i1 and i2 of the memory, one (the row of rank i1) only via its read ports RPT, and the other (the row of rank i2) only via its read ports RPF. At the end of the first cycle, in each column of rank k of the addition/subtraction circuit, latch 61 of circuit 500$_k$ stores value $\overline{A_k.B_k}$ corresponding to the complementary of the local carry of rank k of the addition, that is, of the carry of the bit-to-bit addition of values $A_k$ and $B_k$. Further, at the end of the first cycle, latch 62 of circuit $500_k$ stores value $\overline{A_k.B_k}$.

During a second cycle consecutive to the first cycle, the values stored in latches 61 and 62 are transmitted onto the output nodes of the latches. In each column of rank k of the addition/subtraction circuit, the value on the output node of multiplexer 63 is then equal to $XOR(A_k,B_k)$, that is, to the result of the bit-to-bit addition of values $A_k$ and $B_k$. At the end of the second cycle, this value is stored in latch 67. Further, during the second cycle, the local carries of the addition are propagated by NAND gates 64 and 65 and, in each column of rank k of the addition/subtraction circuit, latch 66 of circuit $500_k$ stores the propagated local carry value applied to its node $C_{IN}$. At the end of the second cycle, the value of node $C_{OUT}$ of circuit $500_Q$, corresponding to the final carry value of the addition, is stored in the additional latch (not shown) associated with circuit $500_Q$.

During a third cycle consecutive to the second cycle, the values stored in latches 66 and 67 are transmitted onto the output nodes of the latches. The result of the addition then corresponds to the Q-bit word formed by the Q binary values supplied on output nodes S of circuits $500_k$ of the addition/subtraction circuit having the carry bit stored in the additional latch (not shown) associated with circuit $500_Q$ added thereto.

The way in which an operation of subtraction of two Q-bit operands is carried out is similar to the way in which an addition operation is carried out, but for the fact that, during a subtraction operation, control circuit 14 applies a high-level potential corresponding to binary value '1', for example, potential VDD, onto node $C_{IN}$ of circuit $500_1$ of the addition/subtraction circuit. Further, during the subtraction operation, control circuit 14 controls multiplexer 57 to connect its first data input (0) to its output, and controls multiplexer 63 to connect its first data input (0) to its output.

It should be noted that in the example of FIG. 6, multiplexers 57 and 63 may be controlled by a same control signal delivered by control circuit 14.

Figure 7:
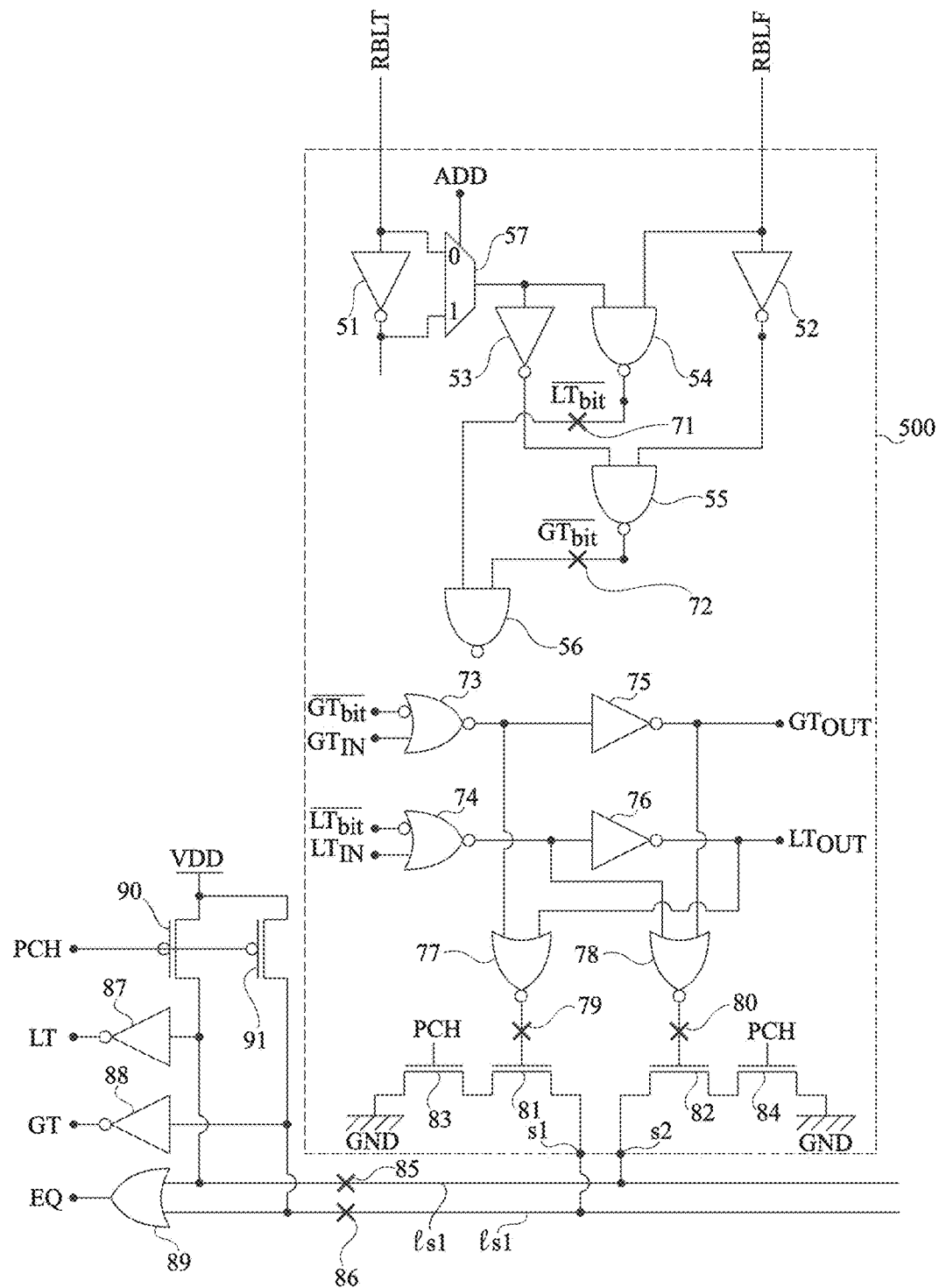
FIG. 7 schematically shows another alternative embodiment of the memory circuit of FIG. 5.

FIG. 7 schematically shows another alternative embodiment of the memory circuit of FIG. 5.

The memory circuit of FIG. 7 comprises the same elements as the memory circuit of FIG. 5, arranged substantially in the same way, and differs from the memory circuit of FIG. 5 in that, in the memory circuit of FIG. 7, in each column of the array, logic circuit 500 comprises additional elements capable of implementing comparison operations. More particularly, in the example of FIG. 7, in each column of the array, logic circuit 500 further comprises a latch 71, for example, a D latch, having its input connected to the output node of NAND gate 54 and having its output connected to the first input of NAND gate 56, and a latch 72, for example, a D latch, having its input connected to the second input of NAND gate 55 and having its output connected to the second input of NAND gate 56. Circuit 500 further comprises a NOR logic gate 73 having its first input connected, via an inverter, to a node $\overline{GT_{bit}}$ connected to the output of latch 72, and having its second input connected to a node $GT_{IN}$. Circuit 500 further comprises a NOR logic gate 74 having a first input connected, via an inverter, to a node $\overline{LT_{bit}}$ connected to the output of latch 71, and having its second input connected to a node $LT_{IN}$. Circuit 500 further comprises an inverter 75 having its input connected to the output of NOR gate 73 and having its output connected to a node $GT_{OUT}$, and an inverter 76 having its input connected to the output of NOR gate 74 and having its output connected to a node $LT_{OUT}$. Circuit 500 further comprises a NOR gate 77 having a first input connected to the output of NOR gate 73 and having its second input connected to node $LT_{OUT}$, and a NOR gate 78 having a first input connected to the output of NOR gate 74 and having its second input connected to node $GT_{OUT}$. Circuit 500 further comprises a latch 79, for example, a D latch, having its input connected to the output of NOR gate 77, and a latch 80, for example, a D latch, having its input connected to the output of NOR gate 78. In this example, circuit 500 further comprises a transistor 81 having its gate connected to the output of latch 79, and a transistor 82 having its gate connected to the output of latch 80. Transistor 81 has a first conduction node connected to an output node s1 of circuit 500 and a second conduction node connected to ground (GND) and transistor 82 has a first conduction node connected to an output node s2 of circuit 500 and a second conduction node connected to ground (GND). In the shown example, the second conduction node of transistor 81 is grounded via a transistor 83, and the second conduction node of transistor 82 is grounded via a transistor 84. In the shown example, transistors 81, 82, 83, 84 are N-channel MOS transistors. Further, in this example, transistors 83 and 84 have their gates connected to a same node of application of a control signal PCH.

In the memory circuit of FIG. 7, the circuits 500 of a plurality of columns in the array, for example, neighboring columns of the array, are chained via their nodes $GT_{IN}$, $GT_{OUT}$ et $LT_{IN}$, $LT_{OUT}$ to form a comparison circuit. It is considered as an example that the circuits 500 of R different columns of the array are chained to form a circuit of comparison of R-bit operands. Reference $500_1$ designates hereafter the circuit of the 1-th column of the assembly of R columns forming the comparison circuit, 1 being an integer in the range from 1 to R and R being an integer smaller than or equal to N (N designating the number of columns in the array). In this example, the columns of low rank 1 of the comparison circuit correspond to the most significant bits of the comparison circuit, and the columns of high rank 1 of the comparison circuit correspond to the least significant bits of the comparison circuit. Except for circuit $500_1$, each circuit $500_1$ of the comparison circuit has its node $GT_{IN}$ connected to node $GT_{OUT}$ of the circuit of previous rank $500_{1-1}$, and has its node $LT_{IN}$ connected to node $LT_{OUT}$ of the circuit of previous rank $500_{1-1}$. The output nodes s1 of the R circuits $500_1$ of the comparison circuit are connected to a same conductive output track 1s1 of the comparison circuit, and the output nodes s2 of the R circuits $500_1$ of the comparison circuit are connected to a same second conductive output track 1s2 of the comparison circuit. The comparison circuit further comprises a latch 85, for example, a D latch, having its input connected to conductive track 1s1, and a latch 86, for example, a D latch, having its input connected to conductive track 1s2. The comparison circuit further comprises an inverter 87 having its input connected to the output of latch 85, and an inverter 88 having its input connected to the output of latch 86. In this example, the comparison circuit further comprises an OR gate 89 having a first input connected to the output of latch 85 and having its second input connected to the output of latch 86. The output of inverter 87 is connected to a node LT, the output of inverter 88 is connected to a node GT, and the output of OR gate 89 is connected to a node EQ. The comparison circuit further comprises a transistor 90 connecting, via its conduction nodes, conductive track 1s1 to a node of application of a high reference potential, for example, high power supply potential VDD, and a transistor 91 connecting, via its conduction nodes, conductive track 1s2 to node VDD. Transistors 90 and 91 have their gates connected to a same node of application of a control signal. In this example, transistors 90 and 91 are P-channel MOS transistors and have their gates connected to the same control node PCH as transistors 83 and 84.

The way in which a comparison operation with two R-bit operands each is carried out will now be described. The R bits $A_1, A_2, \ldots, A_1, \ldots A_R$ (from the most significant bit to the least significant bit) of the first operand are stored in a first row of rank i1 of the memory, respectively in the R columns of rank 1 to R defining the comparison circuit. The R bits $B_1, B_2, \ldots, B_1, \ldots B_R$ (from the most significant bit to the least significant bit) of the second operand are stored in a same second row of rank i2 of the memory, respectively in the R columns of rank 1 to R of the memory defining the comparison circuit. In the example which will be described, the time of execution of the comparison operation corresponds to the time necessary to implement three read cycles in the memory. The described embodiments are however not limited to this specific case. In particular, as a variation, the second and third cycles may be confounded.

During the comparison operation, control circuit 14 applies a low-level potential corresponding to binary value '0', for example, potential GND, onto nodes $GT_{IN}$ and $LT_{IN}$ of circuit $500_1$ of the comparison circuit. Further, control circuit 14 controls multiplexer 57 to connect its first data input (0) to its output.

During a first cycle, control circuit 14 is controlled to simultaneously activate in read mode the two rows of rank i1 and i2 of the memory, one (the row of rank i1) only via its read ports RPT, and the other (the row of rank i2) only via its read ports RPF. At the end of the first cycle, in each column of rank 1 of the comparison circuit, latch 71 of circuit $500_1$ stores value $\overline{A_1, B_1}$ corresponding to the complemented result of the local comparison operation $A_1 < B_1$. Further, latch 72 stores value $\overline{A_1, B_1}$ corresponding to the complemented result of the local comparison operation $A_1 > B_1$.

During a second cycle consecutive to the first cycle, the values stored in latches 71 and 72 are transmitted onto the output nodes of the latches. At the end of the second cycle, the output values of NOR gates 77 and 78 are stored in latches 79 and 80, respectively.

Prior to a third cycle consecutive to the second cycle, transistors 90 and 91 are turned on and then off, to precharge conductive tracks 1s1 and 1s2 to a high level. Further, transistors 83 and 84 are turned on and then off, to precharge to a low level the conduction node common to transistors 81 and 83, and the conduction node common to transistors 82 and 84.

During the third cycle, the values stored in latches 79 and 80 are transmitted onto the output nodes of the latches. At the end of the third cycle, the state of conductive output tracks 1s1 and 1s2 is representative of the final result of the comparison. In this example, during the third cycle, the level of conductive track 1s1 is stored in latch 85, and the level of conductive track 1s2 is stored in latch 86.

The state of output node LT of the comparison circuit then corresponds to the result of comparison operation $A_1 A_2 \ldots A_1 \ldots A_R < B_1 B_2 \ldots B_1 \ldots B_R$. The state of output node GT of the comparison circuit then corresponds to the result of comparison operation $A_1 A_2 \ldots A_1 \ldots A_R > B_1 B_2 \ldots B_1 \ldots B_R$. The state of output node EQ of the comparison circuit then corresponds to the result of comparison operation $A_1 A_2 \ldots A_1 \ldots A_R = B_1 B_2 \ldots B_1 \ldots B_R$.

It should be noted that the alternative embodiments of FIGS. 6 and 7 may be combined. In this case, latches 71 of FIG. 7 and 61 of FIG. 6 may be confounded, and latches 72 of FIG. 7 and 62 of FIG. 6 may be confounded.

It should further be noted that the addition/subtraction operations described in relation with FIG. 6, and/or the comparison operations described in relation with FIG. 7, may be pipeline-processed, to generate one operation result per cycle.

As a variation, the memory circuits described in relation with FIGS. 2, 3, and 4, 5, 6, and 7 may further comprise circuit elements (not shown) enabling to implement shift operations. To achieve this, the memory circuit may comprise, for each column $C_j$, a multiplexer controllable to connect conductive output track RBLT of column $C_j$ either to the write circuit (conductive track WBLT) of the same column $C_j$, to implement a conventional read-write back operation, or to the write circuit of the column $C_{j+1}$ of next rank, to implement a shift operation.

Specific embodiments have been described. Various alterations, modifications, and improvements will occur to those skilled in the art. In particular, the embodiments are not limited to the specific example of an elementary cell described in relation with FIG. 1. More generally, the described embodiments may be adapted to other types of elementary volatile or non-volatile memory cells, having one or a plurality of read ports.

Figure 8:
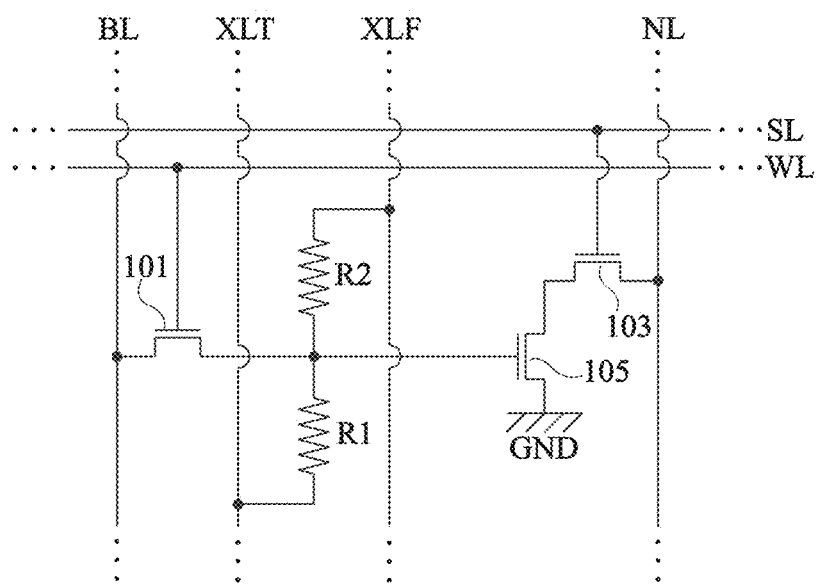
FIG. 8 is an electric diagram of another example of an elementary cell of a memory circuit according to another embodiment.

FIG. 8 is an electric diagram of an example of a nonvolatile elementary memory cell with a single read port, capable of being used as a basic cell of a memory circuit capable of implementing calculation operations.

The elementary cell of FIG. 8 is a resistive memory cell. This cell comprises a storage cell comprising two resistive elements R1 and R2 having a programmable resistance, and one transistor 101. Elements R1 and R2 are series-connected between a node XLT and a node XLF of the cell. The junction point of elements R1 and R2 defines a data storage node of the cell. Transistor 101 is a write access transistor, connecting, via its conduction nodes, the junction point of elements R1 and R2 to a write node BL of the cell. The gate of transistor 101 is connected to a control node WL of the cell. The elementary cell of FIG. 8 further comprises a read port RPT comprising two transistors 103 and 105. Transistors 103 and 105 are series-connected via their conduction nodes between a conductive output track NL of the cell and a node GND of application of a reference potential of the cell. Transistor 105 is located on the side of node GND and has its gate connected to the junction point of resistive elements R1 and R2. Transistor 103 is located on the side of conductive track NL and has its gate connected to a conductive read control track SL. In this example, transistors 101, 103, and 105 are N-channel MOS transistors.

A memory circuit according to an embodiment may comprise a plurality of elementary cells of the type described in relation with FIG. 8, identical or similar, arranged in an array of rows and columns. The cells of a same row are interconnected via their conductive tracks SL, respectively WF, and the cells of a same column are interconnected via their conductive tracks BL, respectively XLT, respectively XLF, respectively NL.

To read from an elementary cell of the memory via its read port RPT, the conductive output track NL of the cell is precharged to a high level, for example, to power supply voltage VDD of the circuit. Transistor 103 of the cell is then turned on by application of a high-level signal to conductive track SL of the cell. After the activation of transistor 103, conductive track RBLT discharges if the potential of the storage node (junction point of resistors R1 and R2) is at a high level (transistor 105 on) and remains substantially at its precharge level if the potential of the storage node is at a low level (transistor 105 off). The reading of the potential of track RBLT via a read circuit not shown, for example, arranged at the foot of the column, enables to determine the value of the data bit stored in the elementary cell.

Similarly to what has been described in relation with FIGS. 2, 3, 4, 5, 6, and 7, the memory of FIG. 8 may comprise a control circuit (not shown) capable of controlling the memory to implement calculation operations. To achieve this, the control circuit is for example capable of simultaneously activating in read mode two or a number greater than two of elementary cells of a same circuit column, via the access ports RPT of these cells, after having precharged output track NL of the column to a high level.

More generally, the described embodiments may be adapted to any type of elementary memory cell comprising at least one data bit storage node, and at least one read port comprising a read-out transistor connected by its gate to the storage node, and a selection transistor series-connected with the read-out transistor between a node of application of a reference potential of the cell and a conductive output track common to all the elementary cells of the same memory column.

The described embodiments preferably apply to differential cells having two individually-controllable read ports.

As a variation, the described embodiments may be adapted to elementary cells comprising a number of read ports greater than two, which has the advantage of increasing the number and the complexity of the logic and/or arithmetic calculation operations capable of being implemented.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory circuit capable of implementing calculation operations, the circuit comprising:
a plurality of elementary memory cells arranged in rows and in columns, each cell comprising:
a first data bit storage node,
a first read-out transistor connected by its gate to said first data bit storage node,
a first selection transistor series-connected with the first read-out transistor between a first node of application of a reference potential of the cell and a first conductive output track common to all the cells of a same column of the circuit, and
a first write access transistor coupling the first data bit storage node to a first conductive write track common to all the cells of a same column of the circuit and distinct from the first conductive output track of the column;
for each column of the circuit, a redirection circuit configurable to, in a first configuration, couple the first conductive output track of the column to a first conductive write track of the circuit; and
a control circuit configured to simultaneously activate the first selection transistors of at least two cells of a same column of the circuit, and to read from the first conductive output track of the column a value representative of the result of a first logic operation having as operands the data stored in said at least two cells, and to write back into the memory circuit said result via the redirection circuit without having it transit through external circuits,
wherein the control circuit is clocked by a clock signal and is configured to, at each clock cycle of the clock signal, receive an instruction signal comprising:
a command signal indicating to the memory circuit the type of operation to be performed;
a read address signal containing addresses of the rows containing the operands of the operation; and
a write address signal containing an address for writing back the result of the operation,
the control circuit being configured to extract from the instruction signal the command, read address and write address signals, and then, successively:
command the activation into read mode of the rows containing the operands of the operation; and
command the writing back of the result of the operation into the memory circuit.

2. The memory circuit of claim 1, wherein the redirection circuit is further configurable to, in a second configuration, couple the first conductive write track of the column to a node of application of an external data signal.

3. The memory circuit of claim 1, wherein the redirection circuit comprises a multiplexer.

4. The memory circuit of claim 1, further comprising, for each column of the circuit, a first inverter having an input node connected to the first conductive output track of the column.

5. The memory circuit of claim 1, wherein each elementary cell further comprises:
a second node for storing a data bit complementary to the bit stored on the first data bit storage node of the cell,
a second read-out transistor connected by its gate to said second storage node,
a second selection transistor series-connected with the second read-out transistor between a second node of application of a reference potential of the cell and a second conductive output track common to all the cells of a same column of the circuit, and
a second write access transistor coupling the second data bit storage node to a second conductive write track common to all the cells of a same column of the circuit,
wherein, in each column of the circuit, the redirection circuit is configurable to, in the first configuration, couple the second conductive output track of the column to a first or second conductive write track of the circuit,
the control circuit being further configured to simultaneously activate the second selection transistors of at least two cells of a same column of the circuit, and to read from the second conductive output track of the column a value representative of the result of a second logic operation having as operands the data stored in said at least two cells, and to write back into the memory circuit said result via the redirection circuit without having it transit through external circuits.

6. The memory circuit of claim 5, wherein the control circuit is further configured to simultaneously activate:
the first and second selection transistors of two cells of a same column of the circuit; or
the first selection transistor of a first circuit cell and the second selection transistor of a second cell of the same column.

7. The memory circuit of claim 5, further comprising, for each column of the circuit, a second inverter having an input node connected to the second conductive output track of the column.

8. The memory circuit of claim 5, further comprising, for each column of the circuit, a logic circuit having a first input connected to the first conductive output track of the column and having a second input connected to the second conductive output track of the column.

9. The memory circuit of claim 8, wherein said logic circuit comprises a NOR logic gate having a first input connected to the first conductive output track of the column and having a second input connected to the second conductive output track of the column.

10. The memory circuit of claim 9, further comprising, for each column of the circuit, a first NAND logic gate having a first input connected to an output node of the NOR logic gate of the column, and a second NAND logic gate having a first input connected to an output node of the first NAND logic gate of the column and having a second input connected to the second conductive output track of the column.

11. The memory circuit of claim 9, wherein, in each column except for the first column of the circuit, the first NAND logic gate has a second input connected to the second conductive output track of a column of previous rank of the circuit.

12. The memory circuit of claim 5, further comprising, for each column:
    a first conductive reference track interconnecting first nodes of application of a reference potential of the column; and
    a second conductive reference track interconnecting second nodes of application of a reference potential of the column.

13. The memory circuit of claim 12, further comprising, for each column:
    a first reference transistor connecting the first reference conductive track to a reference node; and
    a second reference transistor connecting the second reference conductive track to said reference node.

14. The memory circuit of claim 12, further comprising, for each column, an AND logic gate, an OR logic gate, and third, fourth, fifth, and sixth inverters, and wherein:
    the AND logic gate has a first input connected to a node of application of a first binary control signal via the third inverter, and a second input connected to a node of application of a second binary control signal via the fourth inverter;
    the output of the third inverter is connected to the first conductive reference track of the column via the fifth inverter;
    the OR logic gate has a first input connected to the first conductive output track of the column, and a second input connected to the output of the AND logic gate; and
    the output of OR logic gate is connected to the second conductive reference track of the column via the sixth inverter.

15. The memory circuit of claim 8, wherein the logic circuit comprises:
    a first multiplexer having a first input connected to the input of the first inverter and a second input connected to the output of the first inverter;
    a third inverter having its input connected to the output of the first multiplexer;
    a third NAND gate having a first input connected to the output of the first multiplexer and having a second input connected to the input of the second inverter;
    a fourth NAND gate having a first input connected to the output of the third inverter and having a second input connected to the input of the second inverter; and
    a fifth NAND gate having a first input connected to the output of the third NAND gate and having its output connected to the output of the fourth NAND gate.

16. The memory circuit of claim 1, wherein said elementary memory cells are SRAM-type volatile memory cells.

17. The memory circuit of claim 1, wherein said elementary memory cells are non-volatile resistive memory cells.

* * * * *